(12) United States Patent
Kojima et al.

(10) Patent No.: US 8,941,124 B2
(45) Date of Patent: Jan. 27, 2015

(54) SEMICONDUCTOR LIGHT EMITTING DEVICE AND METHOD FOR MANUFACTURING SAME

(71) Applicant: Kabushiki Kaisha Toshiba, Minato-ku (JP)

(72) Inventors: Akihiro Kojima, Kanagawa-ken (JP); Takayoshi Fujii, Kanagawa-ken (JP); Yoshiaki Sugizaki, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/968,881

(22) Filed: Aug. 16, 2013

(65) Prior Publication Data

US 2013/0334539 A1 Dec. 19, 2013

Related U.S. Application Data

(63) Continuation of application No. PCT/JP2011/005228, filed on Sep. 15, 2011.

(30) Foreign Application Priority Data

Mar. 15, 2011 (JP) .................................. 2011-056438

(51) Int. Cl.
*H01L 27/15* (2006.01)
*H01L 21/00* (2006.01)
(Continued)

(52) U.S. Cl.
CPC ................. *H01L 33/32* (2013.01); *H01L 33/44* (2013.01); *H01L 33/0075* (2013.01); *H01L 33/486* (2013.01); *H01L 2924/0002* (2013.01)
USPC .................. 257/79; 257/80; 257/81; 257/82; 438/22; 438/29; 438/68

(58) Field of Classification Search
USPC ................. 438/22, 25, 29, 46, 47, 64, 65, 68; 257/76, 79–82, 99, 103
See application file for complete search history.

(56) References Cited

U.S. PATENT DOCUMENTS

| | | | |
|---|---|---|---|
| 7,208,772 B2 | 4/2007 | Lee et al. | |
| 7,388,232 B2 | 6/2008 | Suehiro et al. | |

(Continued)

FOREIGN PATENT DOCUMENTS

| | | |
|---|---|---|
| CN | 1947222 A | 4/2007 |
| JP | 2000-244012 | 9/2000 |

(Continued)

OTHER PUBLICATIONS

International Search Report issued on Jan. 23, 2012 for PCT/JP2011/005228 filed on Sep. 15, 2011 in English.

(Continued)

*Primary Examiner* — Hsien Ming Lee
(74) *Attorney, Agent, or Firm* — Oblon, Spivak, McClelland, Maier & Neustadt, L.L.P.

(57) ABSTRACT

According to one embodiment, a semiconductor light emitting device includes a semiconductor layer, a p-side electrode, an n-side electrode, and an inorganic film. The semiconductor layer includes a first surface having an unevenness, a second surface opposite to the first surface, and a light emitting layer. The semiconductor layer includes gallium nitride. The inorganic film is provided to conform to the unevenness of the first surface and in contact with the first surface. The inorganic film has main components of silicon and nitrogen. The inorganic film has a refractive index between a refractive index of the gallium nitride and a refractive index of air. An unevenness is formed also in a surface of the inorganic film.

19 Claims, 14 Drawing Sheets

(51) Int. Cl.
*H01L 33/32* (2010.01)
*H01L 33/44* (2010.01)
*H01L 33/00* (2010.01)
*H01L 33/48* (2010.01)

(56) References Cited

U.S. PATENT DOCUMENTS

| | | | |
|---|---|---|---|
| 8,049,330 B2 | 11/2011 | Tain et al. | |
| 8,110,421 B2 | 2/2012 | Sugizaki et al. | |
| 8,129,743 B2 | 3/2012 | Suehiro et al. | |
| 8,148,183 B2 | 4/2012 | Hamasaki et al. | |
| 8,278,676 B2 | 10/2012 | Kojima et al. | |
| 8,288,843 B2 | 10/2012 | Kojima et al. | |
| 8,319,246 B2 | 11/2012 | Sugizaki et al. | |
| 8,350,285 B2 | 1/2013 | Sugizaki et al. | |
| 8,367,523 B2 | 2/2013 | Sugizaki et al. | |
| 8,368,089 B2 | 2/2013 | Kojima et al. | |
| 8,373,192 B2 | 2/2013 | Sugizaki et al. | |
| 8,377,726 B2 | 2/2013 | Kojima et al. | |
| 8,378,377 B2 | 2/2013 | Sugizaki et al. | |
| 8,436,378 B2 | 5/2013 | Kojima et al. | |
| 8,445,916 B2 | 5/2013 | Kojima et al. | |
| 8,502,260 B2 | 8/2013 | Sugizaki et al. | |
| 2005/0093008 A1 | 5/2005 | Suehiro et al. | |
| 2005/0141240 A1 | 6/2005 | Hata et al. | |
| 2010/0140640 A1 | 6/2010 | Shimokawa et al. | |
| 2010/0264443 A1 | 10/2010 | Wakai et al. | |
| 2011/0204396 A1 | 8/2011 | Akimoto et al. | |
| 2011/0220931 A1 | 9/2011 | Kojima et al. | |
| 2011/0284910 A1 | 11/2011 | Iduka et al. | |
| 2011/0291148 A1 | 12/2011 | Sugizaki et al. | |
| 2011/0297965 A1 | 12/2011 | Akimoto et al. | |
| 2011/0297980 A1 | 12/2011 | Sugizaki et al. | |
| 2011/0297995 A1 | 12/2011 | Akimoto et al. | |
| 2011/0298001 A1 | 12/2011 | Akimoto et al. | |
| 2011/0300651 A1 | 12/2011 | Kojima et al. | |

FOREIGN PATENT DOCUMENTS

| | | |
|---|---|---|
| JP | 2002-118293 | 4/2002 |
| JP | 2006-5369 A | 1/2006 |
| JP | 2006-41479 A | 2/2006 |
| JP | 2010-165754 A | 7/2010 |
| JP | 2010-251807 A | 11/2010 |
| KR | 10-0999779 B1 | 12/2010 |

OTHER PUBLICATIONS

Office Action issued Mar. 19, 2014, in Japanese Patent Application No. 2011-056438 (with English-language translation).

Combined Office Action and Search Report issued on Feb. 24, 2014 in Taiwanese Patent Application No. 100133954 (with English translation).

Korean Office Action issued Aug. 20, 2014, in Korea Patent Application No. 10-2013-7023265 (with English translation).

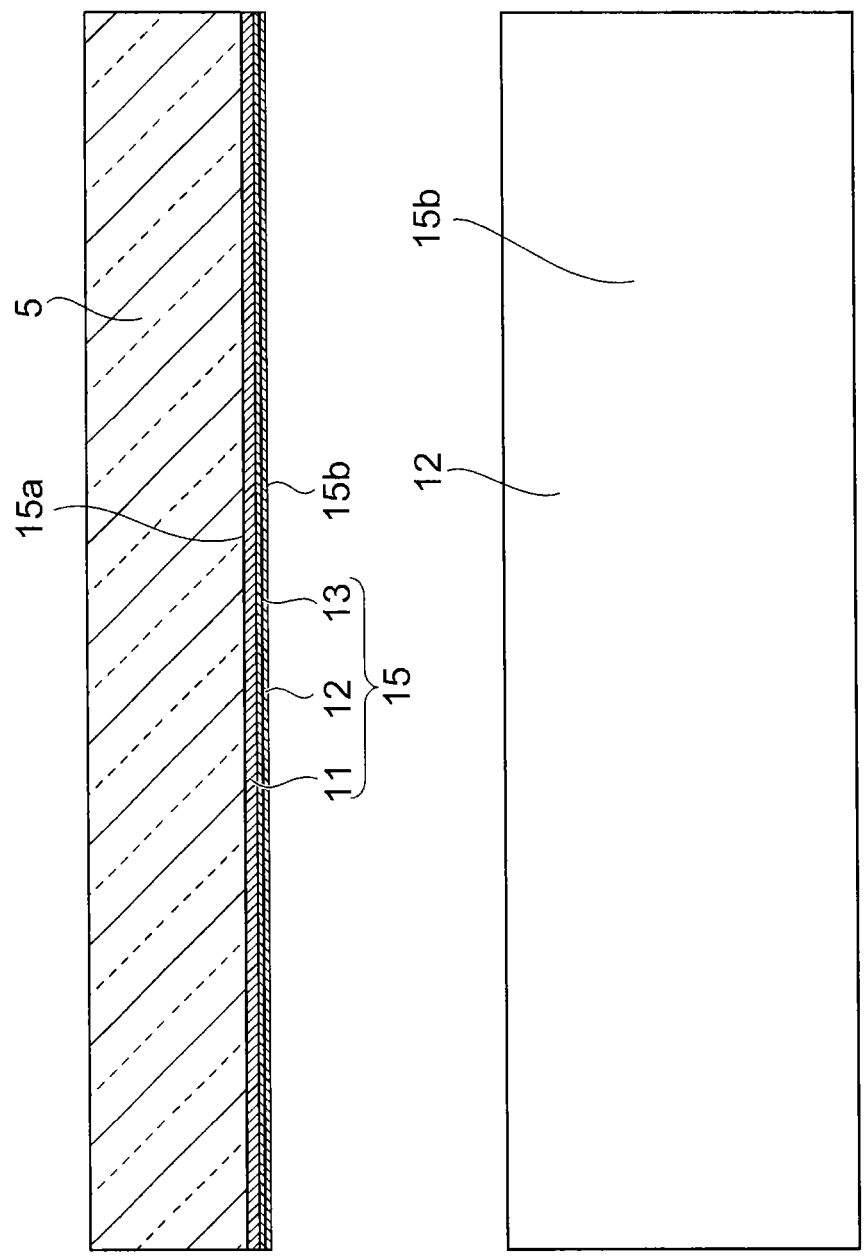

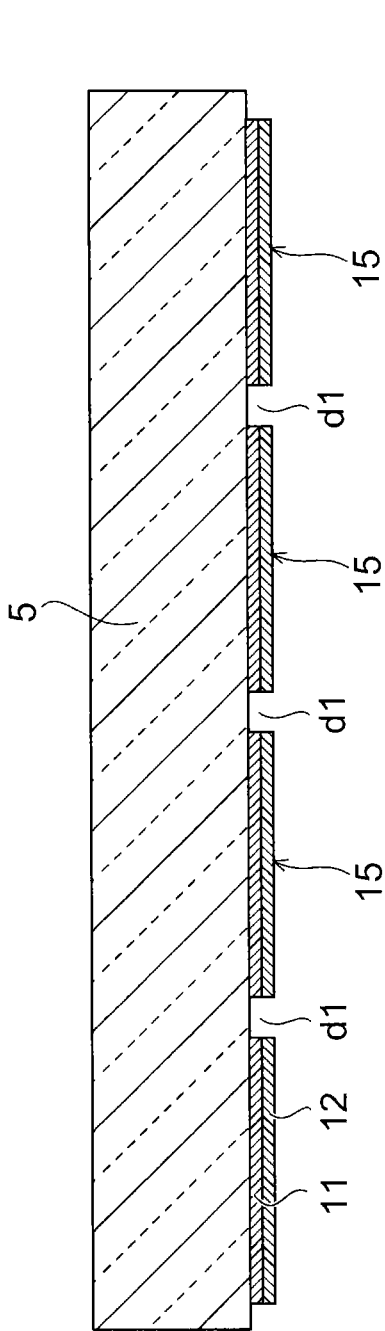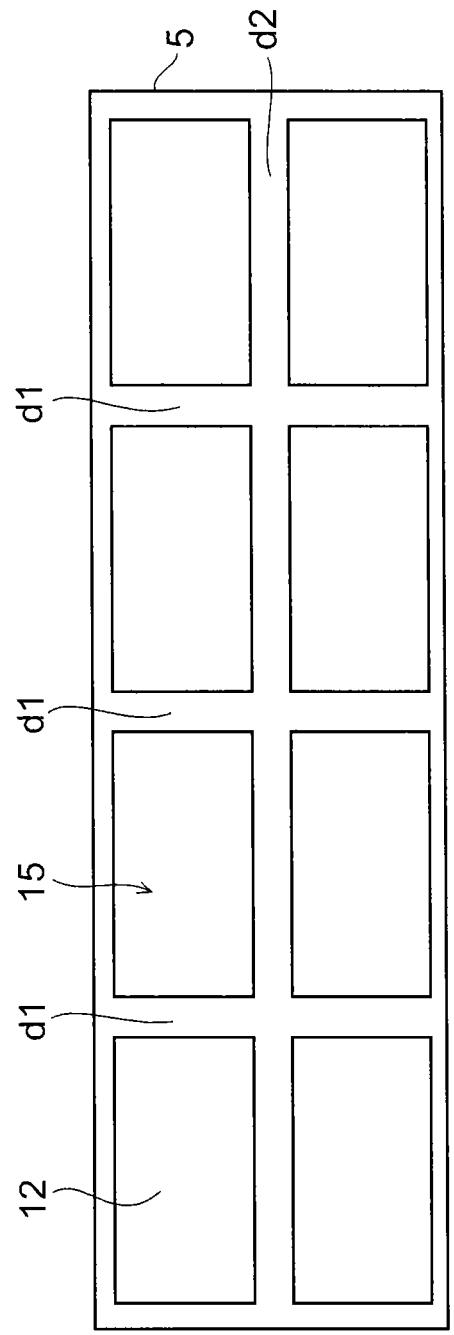

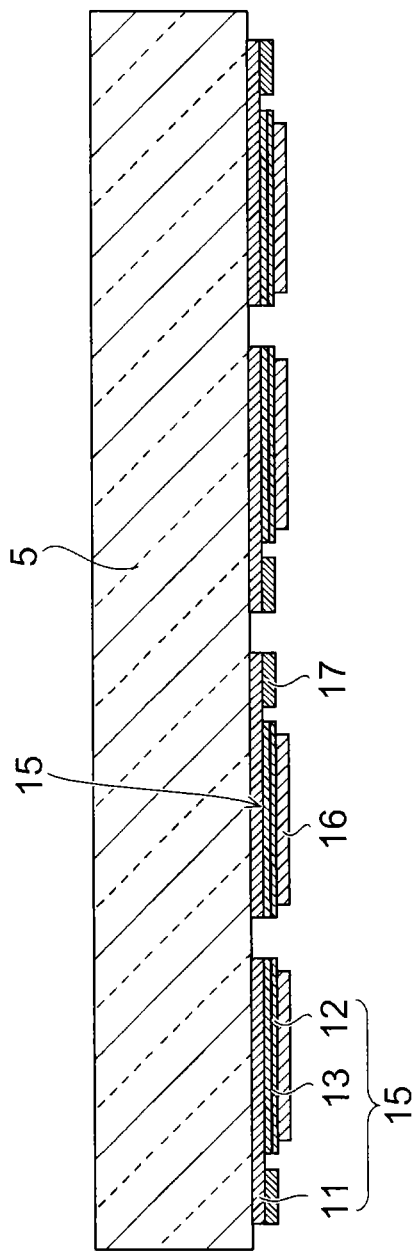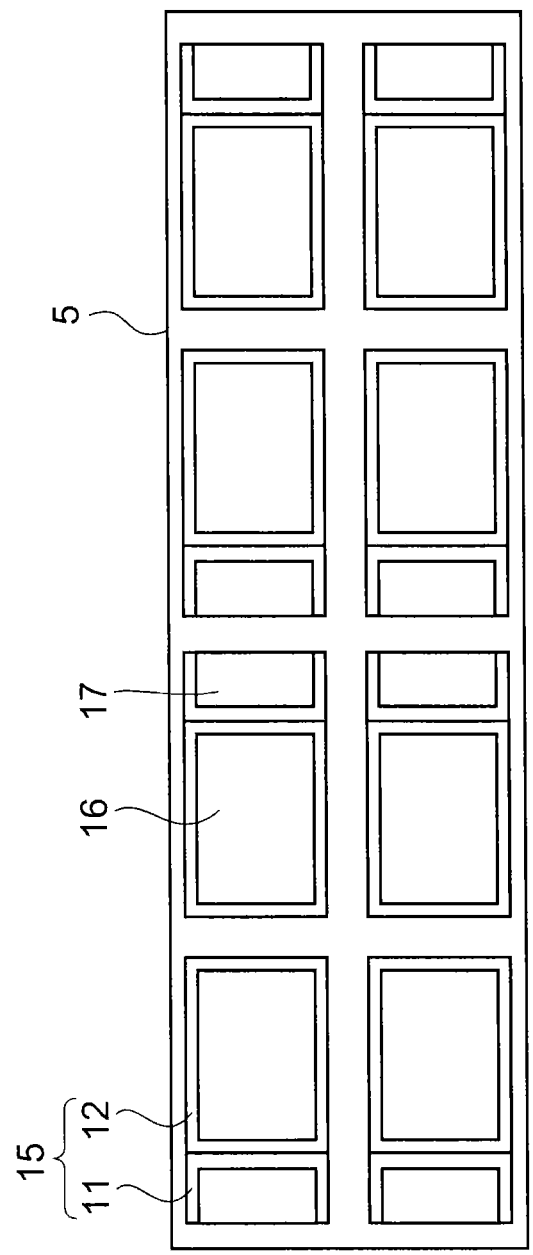
FIG. 5A
FIG. 5B

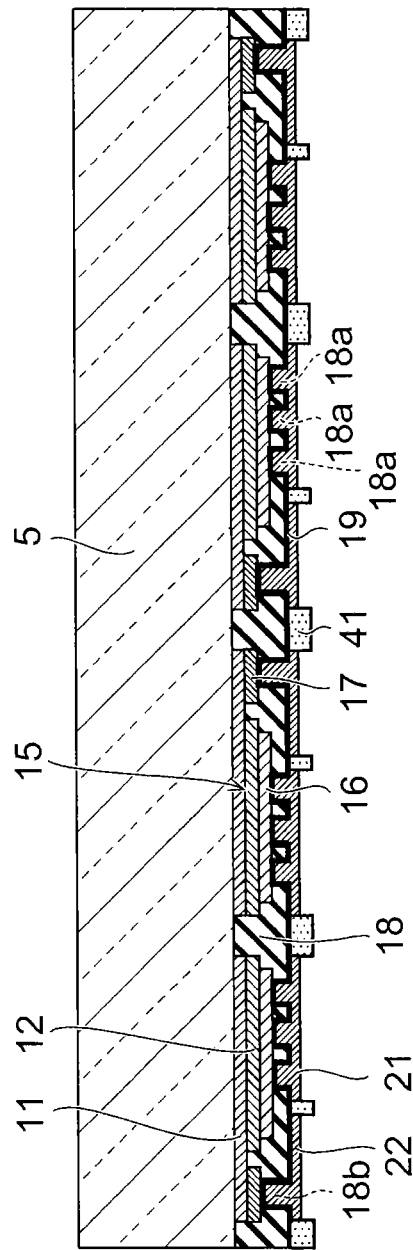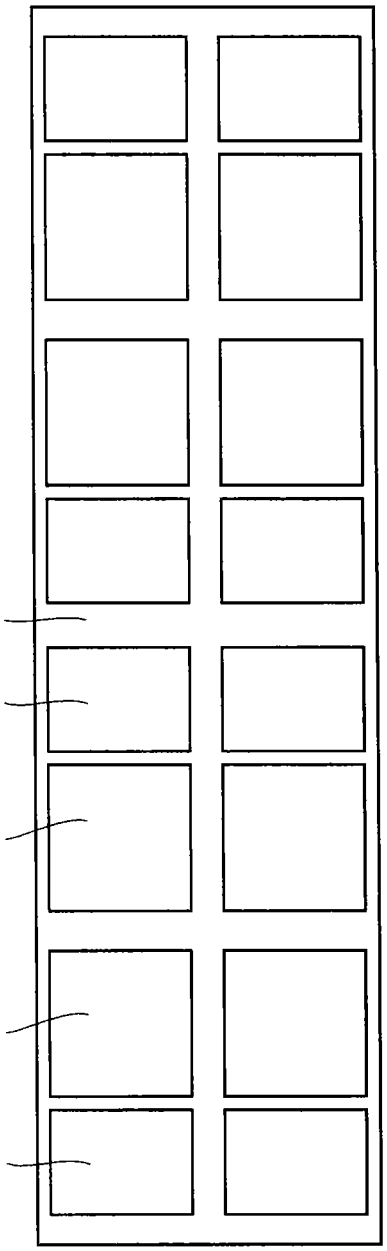
FIG. 7A
FIG. 7B

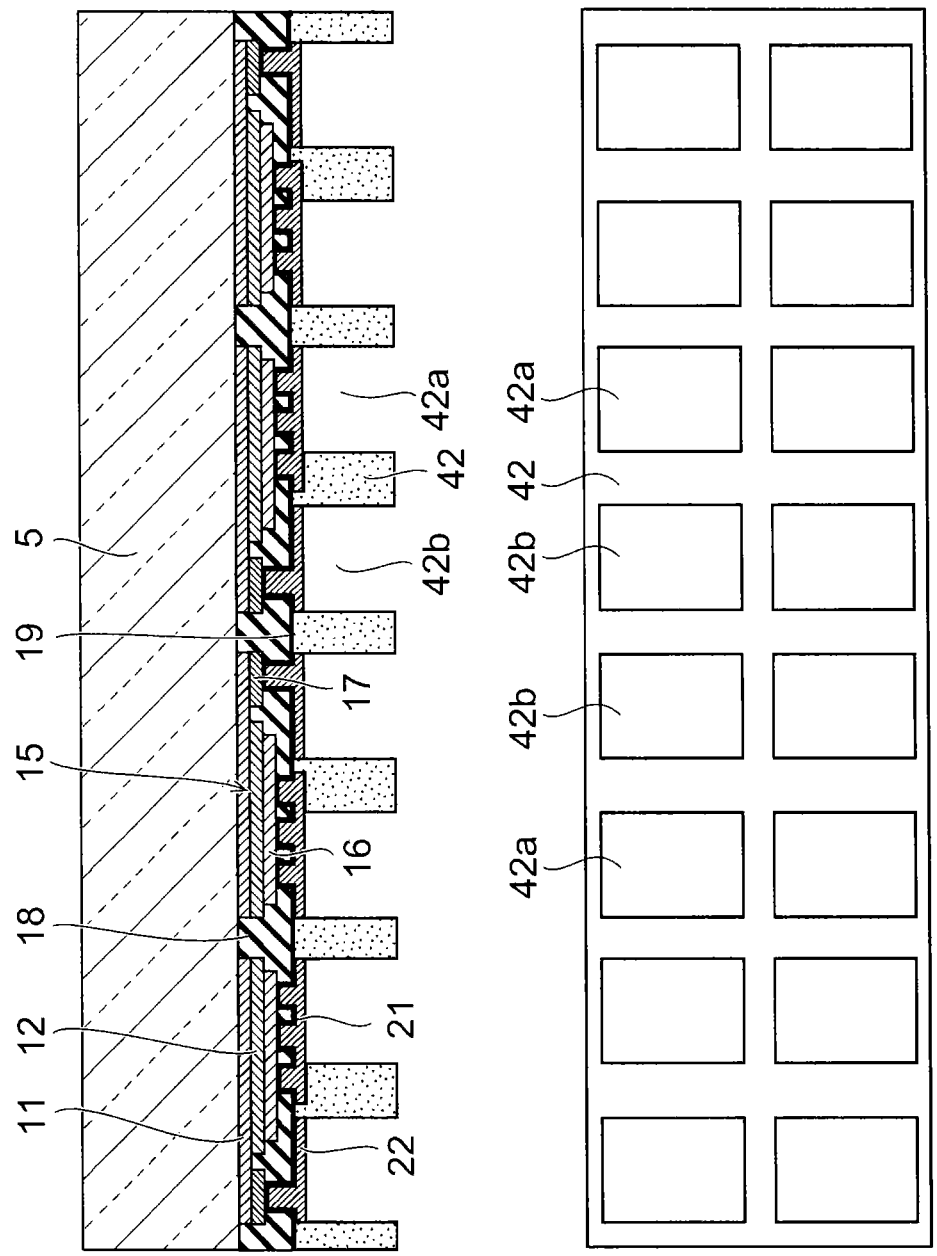

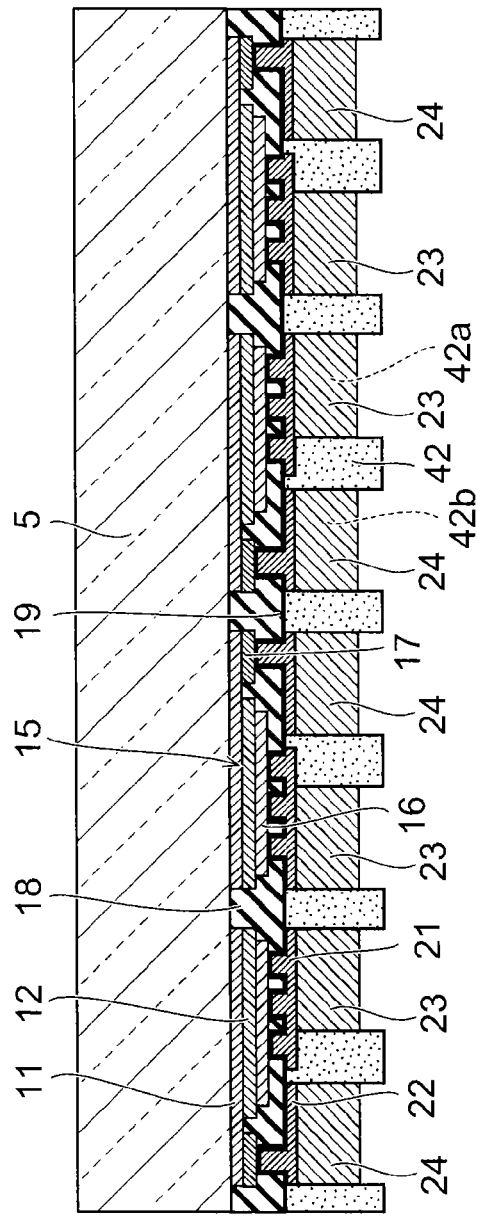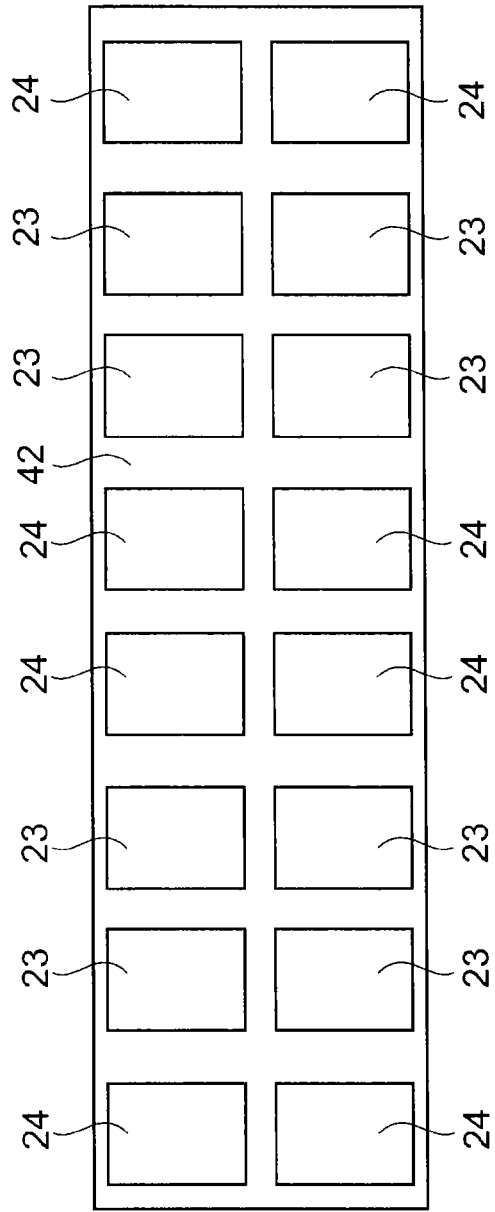
FIG. 9A
FIG. 9B

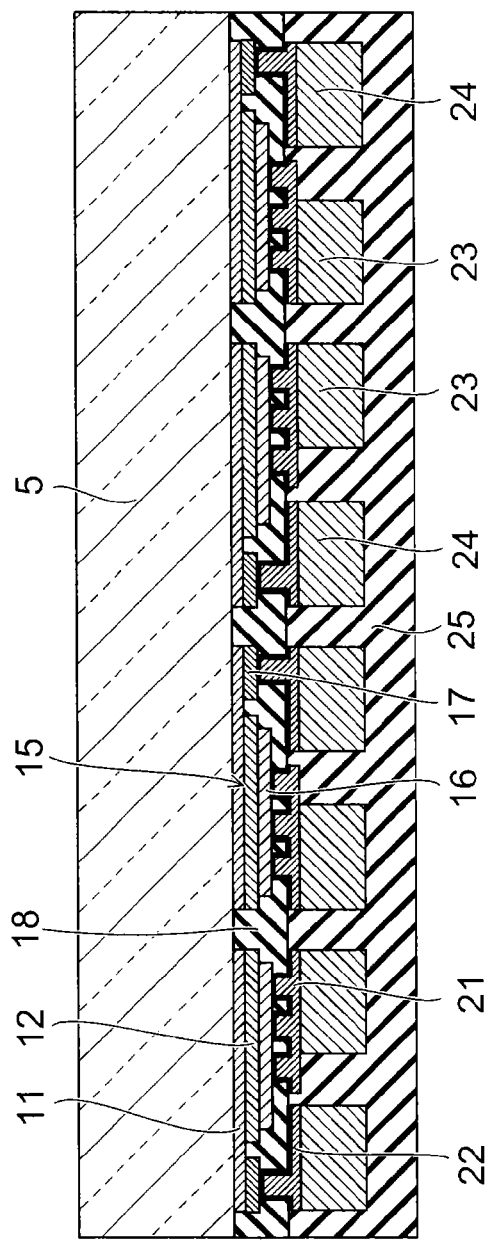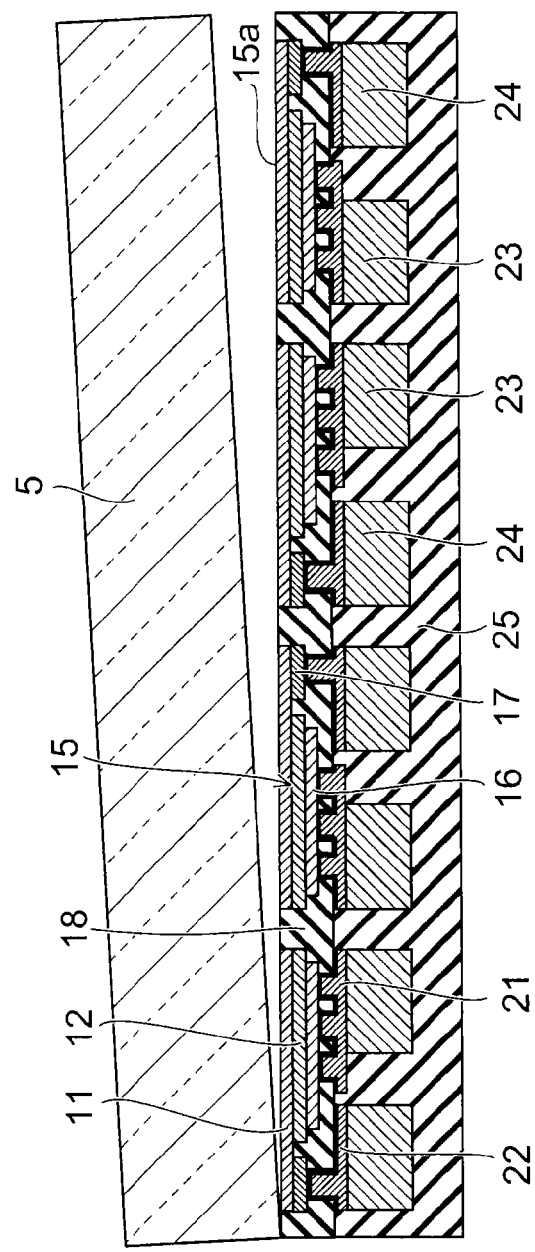
FIG. 11A
FIG. 11B

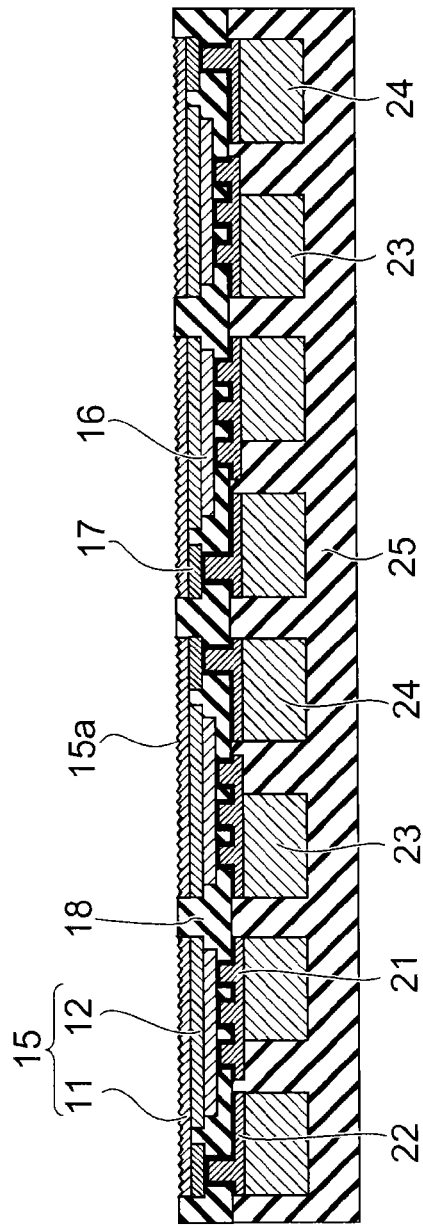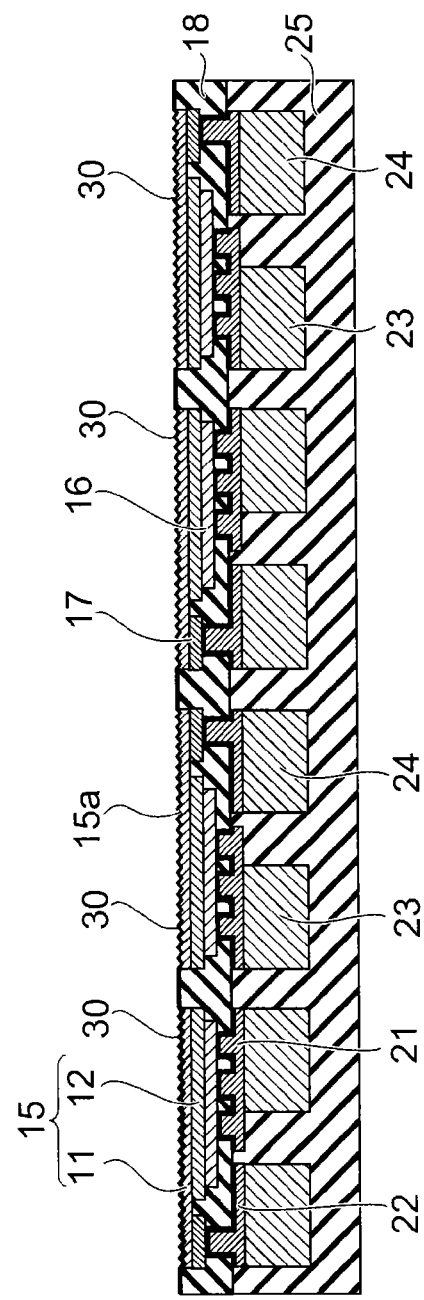
FIG. 12A
FIG. 12B

SEMICONDUCTOR LIGHT EMITTING DEVICE AND METHOD FOR MANUFACTURING SAME

CROSS-REFERENCE TO RELATED APPLICATIONS

This is a continuation application of International Application PCT/JP2011/005228, filed on Sep. 15, 2011; the entire contents of which are incorporated herein by reference. This application also claims priority to Japanese Application No. 2011-056438, filed on Mar. 15, 2011. The entire contents of each are incorporated herein by reference.

FIELD

Embodiments described herein relate generally to a semiconductor light emitting device and a method for manufacturing the same.

BACKGROUND

There are many cases where a light emitting layer using a gallium nitride (GaN)-based material is formed on a sapphire substrate. In a flip chip mount-type device in which a p-side electrode and an n-side electrode are provided on the side opposite to the extraction surface of the light, the light is extracted from the GaN layer through the sapphire substrate into the air. The refractive indexes of the GaN layer, the sapphire substrate, and the air are 2.4, 1.8, and 1.0, respectively; and the refractive index of the medium changes in stages in the direction in which the light is extracted.

On the other hand, a structure has been proposed in which the sapphire substrate is removed to downsize and reduce the thickness of the device. In such a case, because there is no sapphire substrate, the refractive index of the medium changes greatly in the direction from the GaN layer toward the air; and the light extraction efficiency may decrease.

BRIEF DESCRIPTION OF THE DRAWINGS

FIG. 2A to FIG. 13B are schematic views illustrating a method for manufacturing the semiconductor light emitting device of the embodiment.

DETAILED DESCRIPTION

Figure 1A:
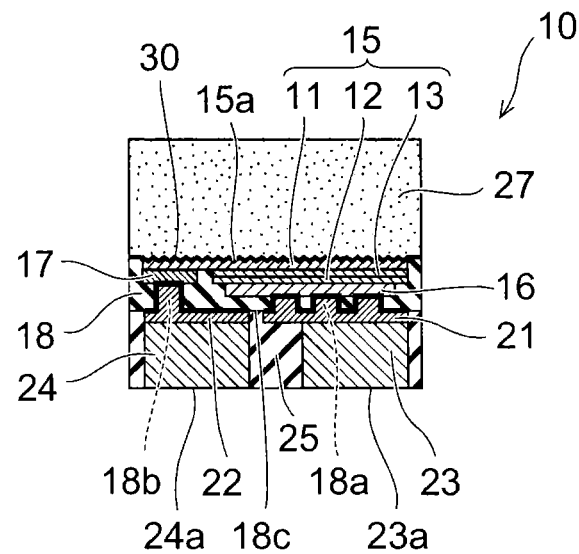
FIGS. 1A and 1B are schematic cross-sectional views of a semiconductor light emitting device of an embodiment.

According to one embodiment, a semiconductor light emitting device includes a semiconductor layer, a p-side electrode, an n-side electrode, and an inorganic film. The semiconductor layer includes a first surface having an unevenness, a second surface opposite to the first surface, and a light emitting layer. The semiconductor layer includes gallium nitride. The p-side electrode is provided on the second surface in a region including the light emitting layer. The n-side electrode is provided on the second surface in a region not including the light emitting layer. The inorganic film is provided to conform to the unevenness of the first surface and in contact with the first surface. The inorganic film has main components of silicon and nitrogen. The inorganic film has a refractive index between a refractive index of the gallium nitride and a refractive index of air. An unevenness is formed also in a surface of the inorganic film.

Embodiments will now be described with reference to the drawings. Similar components in the drawings are marked with like reference numerals.

A region of a portion of a wafer including multiple semiconductor layers 15 (chips) is illustrated in the drawings that illustrate manufacturing processes.

Figure 1B:
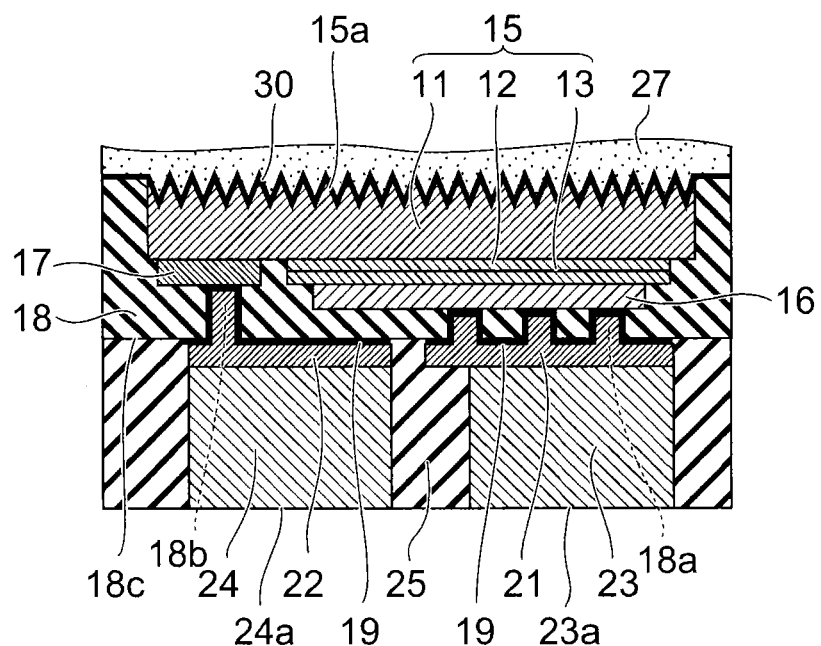

FIG. 1A is a schematic cross-sectional view of a semiconductor light emitting device 10 of an embodiment; and FIG. 1B is an enlarged view of the main components of FIG. 1A.

The semiconductor light emitting device 10 includes the semiconductor layer 15. The semiconductor layer 15 includes a first surface 15a and a second surface opposite to the first surface 15a. Electrodes and interconnect layers are provided on the second surface side; and light is emitted to the outside mainly from the first surface 15a opposite to the second surface.

The semiconductor layer 15 includes a first semiconductor layer 11 and a second semiconductor layer 12. The first semiconductor layer 11 and the second semiconductor layer 12 include gallium nitride. The first semiconductor layer 11 includes, for example, a foundation buffer layer, an n-type layer, etc.; and the n-type layer functions as a lateral-direction path of current. The second semiconductor layer 12 includes a stacked structure in which a light emitting layer (an active layer) 13 is interposed between an n-type layer and a p-type layer.

The second surface side of the semiconductor layer 15 is patterned into an uneven configuration. A protrusion formed on the second surface side includes the light emitting layer 13. A p-side electrode 16 is provided on the top surface of the second semiconductor layer 12, i.e., the top surface of the protrusion. The p-side electrode 16 is provided in the region including the light emitting layer 13.

A region without the second semiconductor layer 12 including the light emitting layer 13 is provided beside the protrusion on the second surface side of the semiconductor layer 15; and an n-side electrode 17 is provided on the top surface of the first semiconductor layer 11 of the region. The n-side electrode 17 is provided in the region not including the light emitting layer 13.

Figure 4A:
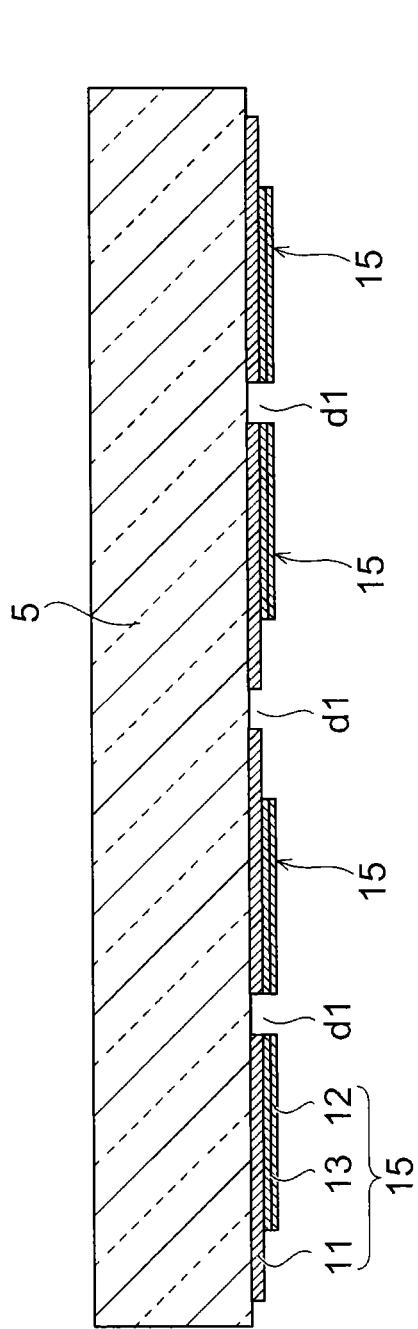
Figure 4B:
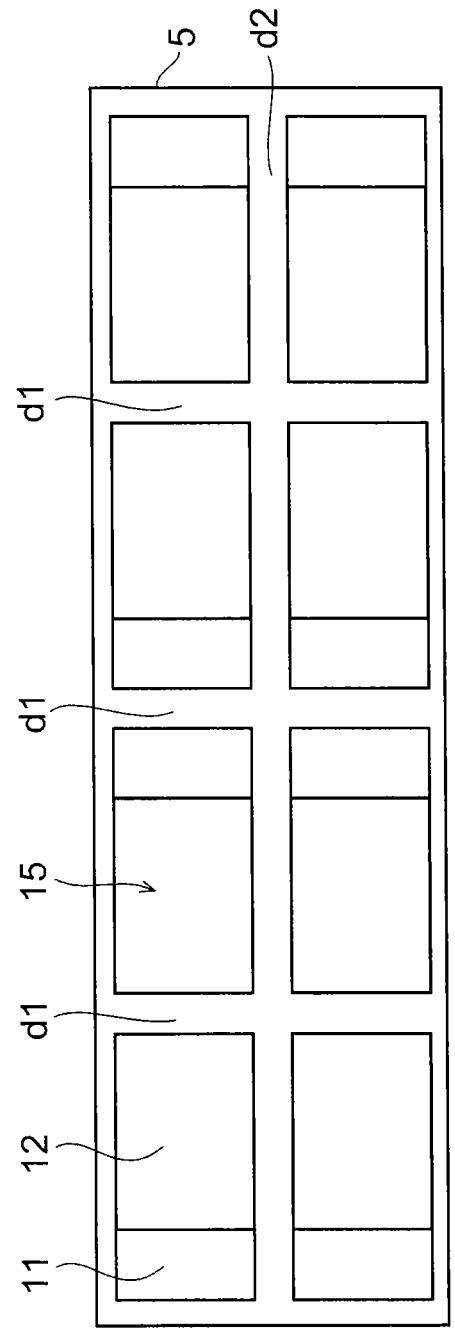

On the second surface side of the semiconductor layer 15 as illustrated in FIG. 4B, the surface area of the second semiconductor layer 12 including the light emitting layer 13 is greater than the surface area of the first semiconductor layer 11 not including the light emitting layer 13.

In one of the semiconductor layers 15 as illustrated in FIG. 5B, the p-side electrode 16 provided in the region including the light emitting layer 13 has a surface area greater than that of the n-side electrode 17 provided in the region not including the light emitting layer 13. Thereby, a wide light emitting region is obtained. The layout of the p-side electrode 16 and the n-side electrode 17 illustrated in FIG. 5B is an example and is not limited to the layout.

A first insulating layer (hereinbelow called simply the insulating layer) 18 is provided on the second surface side of the semiconductor layer 15. The insulating layer 18 covers the semiconductor layer 15, the p-side electrode 16, and the n-side electrode 17. There are cases where another insulating film is provided (e.g., a silicon oxide film) between the insulating layer 18 and the semiconductor layer 15. The insulating layer 18 is, for example, a resin such as polyimide having excellent patternability of ultra-fine openings. Alternatively, an inorganic substance such as silicon oxide, silicon nitride, etc., may be used as the insulating layer 18.

The insulating layer 18 includes an interconnect surface 18c on the side opposite to the semiconductor layer 15. A p-side interconnect layer 21 and an n-side interconnect layer 22 are provided apart from each other on the interconnect surface 18c.

The p-side interconnect layer 21 is provided also inside a first via 18a made in the insulating layer 18 to reach the p-side electrode 16 and is electrically connected to the p-side electrode 16. It is not always necessary for the p-side interconnect layer 21 to be formed on the insulating layer 18. For example, a structure may be used in which the p-side interconnect layer 21 is provided only on the p-side electrode 16.

The n-side interconnect layer 22 is provided also inside a second via 18b made in the insulating layer 18 to reach the n-side electrode 17 and is electrically connected to the n-side electrode 17.

A p-side metal pillar 23 is provided on the surface of the p-side interconnect layer 21 on the side opposite to the p-side electrode 16. The p-side interconnect layer 21 and the p-side metal pillar 23 are included in the p-side interconnect unit of the embodiment.

An n-side metal pillar 24 is provided on the surface of the n-side interconnect layer 22 on the side opposite to the n-side electrode 17. The n-side interconnect layer 22 and the n-side metal pillar 24 are included in the n-side interconnect unit of the embodiment.

A resin layer 25 is provided as a second insulating layer on the interconnect surface 18c of the insulating layer 18. The resin layer 25 covers the p-side interconnect layer 21 and the n-side interconnect layer 22. The resin layer 25 is filled between the p-side metal pillar 23 and the n-side metal pillar 24 to cover the side surface of the p-side metal pillar 23 and the side surface of the n-side metal pillar 24.

The surface of the p-side metal pillar 23 on the side opposite to the p-side interconnect layer 21 functions as a p-side external terminal 23a. The surface of the n-side metal pillar 24 on the side opposite to the n-side interconnect layer 22 functions as an n-side external terminal 24a.

The p-side external terminal 23a and the n-side external terminal 24a are exposed from the insulating layer 18 and the resin layer 25 and are bonded to pads formed in the mounting substrate with a bonding agent such as solder, another metal, an electrically conductive material, etc.

The distance between the p-side external terminal 23a and the n-side external terminal 24a exposed at the same surface is greater than the distance between the p-side interconnect layer 21 and the n-side interconnect layer 22 on the interconnect surface 18c of the insulating layer 18. In other words, the p-side external terminal 23a and the n-side external terminal 24a are separated by a distance such that the p-side external terminal 23a and the n-side external terminal 24a are not shorted to each other by solder, etc., when mounting to the mounting substrate.

The planar size of the p-side interconnect layer 21 is larger than the planar size of the p-side external terminal 23a. The p-side interconnect layer 21 can be formed using a low-resistance metal such as, for example, copper. Therefore, it is possible to supply current to the second semiconductor layer 12 including the light emitting layer 13 with a more uniform distribution as the surface area of the p-side interconnect layer 21 increases. Further, the thermal conductivity of the p-side interconnect layer 21 also can be increased; and it is possible to efficiently release the heat of the second semiconductor layer 12.

The p-side electrode 16 spreads in a region including the light emitting layer 13. Accordingly, by connecting the p-side interconnect layer 21 to the p-side electrode 16 through multiple first vias 18a, the current distribution to the light emitting layer 13 can be improved; and the heat dissipation of the heat of the light emitting layer 13 also can be improved.

The surface area of the n-side interconnect layer 22 is greater than the surface area of the n-side electrode 17; and the contact area between the n-side interconnect layer 22 and the n-side metal pillar 24 is greater than the contact area between the n-side interconnect layer 22 and the n-side electrode 17. A portion of the n-side interconnect layer 22 extends over the interconnect surface 18c of the insulating layer 18 to an overlaying position under the light emitting layer 13.

Thereby, a wider lead electrode can be formed from the n-side electrode 17 provided in a narrow region not including the light emitting layer 13 via the first n-side interconnect layer 22 while obtaining a high light output due to the light emitting layer 13 being formed over a wide region.

The contact area between the p-side interconnect layer 21 and the p-side metal pillar 23 may be greater than or less than the contact area between the p-side interconnect layer 21 and the p-side electrode 16.

The first semiconductor layer 11 is electrically connected to the n-side metal pillar 24 including the n-side external terminal 24a via the n-side electrode 17 and the n-side interconnect layer 22. The second semiconductor layer 12 including the light emitting layer 13 is electrically connected to the p-side metal pillar 23 including the p-side external terminal 23a via the p-side electrode 16 and the p-side interconnect layer 21.

The p-side metal pillar 23 is thicker than the p-side interconnect layer 21; and the n-side metal pillar 24 is thicker than the n-side interconnect layer 22. The thicknesses of the p-side metal pillar 23, the n-side metal pillar 24, and the resin layer 25 are thicker than the semiconductor layer 15. Here, the thickness refers to the thickness in the vertical direction of FIGS. 1A and 1B.

The thicknesses of the p-side metal pillar 23 and the n-side metal pillar 24 are thicker than the thickness of the stacked body including the semiconductor layer 15, the p-side electrode 16, the n-side electrode 17, and the insulating layer 18. The aspect ratio (the ratio of the thickness to the planar size) of each of the metal pillars 23 and 24 is not limited to being not less than 1; and the ratio thereof may be less than 1. In other words, the thicknesses of the metal pillars 23 and 24 may be less than the planar sizes thereof.

Accordingly, the semiconductor layer 15 can be stably supported by the p-side metal pillar 23, the n-side metal pillar 24, and the resin layer 25 and the mechanical strength of the semiconductor light emitting device 10 can be increased even without a substrate 5 described below which is used to form the semiconductor layer 15.

Copper, gold, nickel, silver, etc., can be used as the materials of the p-side interconnect layer 21, the n-side interconnect layer 22, the p-type metal pillar 23, and the n-side metal pillar 24. Of these, good thermal conductivity, high migration resistance, and excellent adhesion with insulating materials are obtained when copper is used.

The resin layer 25 reinforces the p-side metal pillar 23 and the n-side metal pillar 24. It is notable for the resin layer 25 to have a coefficient of thermal expansion near to or the same as that of the mounting substrate. Examples of such a resin layer 25 include, for example, an epoxy resin, a silicone resin, a fluorocarbon resin, etc.

The stress applied to the semiconductor layer 15 via solder, etc., in the state in which the semiconductor light emitting device 10 is mounted to the mounting substrate via the p-side external terminal 23a and the n-side external terminal 24a can be relieved by being absorbed by the p-side metal pillar 23 and the n-side metal pillar 24.

A micro unevenness is formed in the first surface 15a. The unevenness is formed by performing wet etching (frosting) on the first surface 15a using, for example, an alkaline solution. The height of the protrusions or the depth of the recesses of the unevenness is about 1.0 to 1.2 micrometers. By providing the unevenness in the first surface 15a, which is the main extraction surface of the light emitted from the light emitting layer 13, the light incident on the first surface 15a at various angles can be extracted outside the first surface 15a without undergoing total internal reflection.

An inorganic film 30 having main components of silicon (Si) and nitrogen (N) is formed on the first surface 15a. For example, a silicon oxynitride film (a SiON film), a silicon nitride film (a SiN film), etc., can be used as the inorganic film 30.

The inorganic film 30 has a refractive index between that of the gallium nitride used in the semiconductor layer 15 and that of air. The inorganic film 30 is a film having a refractive index of, for example, 1.5 to 2.4. The inorganic film 30 is transparent (transmissive) with respect to the light emitted from the light emitting layer 13.

The inorganic film 30 is provided to conform to the unevenness of the first surface 15a and does not fill the recesses of the unevenness of the first surface 15a. In other words, an unevenness reflecting the unevenness of the first surface 15a is formed also in the top surface of the inorganic film 30. The inorganic film 30 has a substantially same thickness on the first surface 15a.

The periphery of the semiconductor layer 15 is covered with the insulating layer 18. The insulating layer 18 includes a first surface facing the same direction (upward in FIGS. 1A and 1B) as does the first surface 15a of the semiconductor layer 15. The inorganic film 30 is provided also on the first surface of the insulating layer 18.

A phosphor layer 27 is provided on the inorganic film 30 as a transparent body transparent to the light emitted from the light emitting layer 13. A lens may be provided on the inorganic film 30 as the transparent body recited above. The phosphor layer 27 is filled also inside the recesses of the unevenness of the top surface of the inorganic film 30.

The phosphor layer 27 includes a transparent resin and phosphors dispersed in the transparent resin. The phosphor layer 27 is capable of absorbing the light emitted from the light emitting layer 13 and emitting a wavelength-converted light. Therefore, the semiconductor light emitting device 10 is capable of emitting a mixed light of the light from the light emitting layer 13 and the wavelength-converted light of the phosphor layer 27.

The transparent resin inside the phosphor layer 27 has a refractive index between the refractive index of the inorganic film 30 and the refractive index of air. The transparent resin is a resin having a refractive index of, for example, 1.4 to 1.6. For example, a resin having a refractive index of 1.53 may be used as the transparent resin recited above.

For example, white, lamp, etc., can be obtained as the mixed color of a blue light from the light emitting layer 13 and a yellow light which is the wavelength-converted light of the phosphor layer 27 in the case where the light emitting layer 13 is a GaN-based material and the phosphor is a yellow phosphor configured to emit the yellow light. The phosphor layer 27 may have a configuration including multiple types of phosphors (e.g., a red phosphor configured to emit red light and a green phosphor configured to emit green light).

The light emitted from the light emitting layer 13 is emitted to the outside by traveling mainly through the first semiconductor layer 11, the first surface 15a, the inorganic film 30, and the phosphor layer 27.

As described below, the substrate 5 used when forming the semiconductor layer 15 is removed from the first surface 15a. Therefore, the semiconductor light emitting device 10 can be thinner.

Then, in the embodiment, the inorganic film 30 having a refractive index between that of gallium nitride and that of air is provided on the first surface 15a including gallium nitride. Thereby, the light extraction efficiency can be increased by preventing large changes of the refractive index of the medium in the extraction direction of the light through the first surface 15a.

Results of a simulation of the light extraction efficiency showed that, compared to the case where only an unevenness is formed in the first surface 15a without providing the inorganic film 30, the light extraction efficiency was increased about 2% for a structure in which an unevenness having a height of the protrusions or a depth of the recesses of 1.0 to 1.2 micrometers was formed in the top surface of GaN (corresponding to the first surface 15a) having a refractive index of 2.48, a SiON film having a refractive index of 1.90 was formed with a film thickness of 200 nm as the inorganic film 30 to conform to the unevenness, and a resin having a refractive index of 1.41 was formed on the inorganic film 30.

The inorganic film 30 is formed to conform to the unevenness of the first surface 15a; and an unevenness is formed also in the top surface of the inorganic film 30. Therefore, the light incident on the first surface 15a at various angles can pass through the first surface 15a and the inorganic film 30 without undergoing total internal reflection.

Because the semiconductor layer 15 normally is thin at about several micrometers, cracks may occur when forming the unevenness in the first surface 15a, or peeling may occur between the semiconductor layer 15 and the insulating layer 18.

In the embodiment, the first surface 15a is coated with the inorganic film 30. Accordingly, the cracks occurring in the first surface 15a and the gap occurring due to the peeling from the insulating layer 18 can be covered with the inorganic film 30. Therefore, the phosphor layer 27, etc., can be formed on the first surface 15a with good adhesion without the occurrence of voids.

A method for manufacturing the semiconductor light emitting device 10 of the embodiment will now be described with reference to FIG. 2A to FIG. 13B. A region of a portion of the wafer state is illustrated in the drawings that illustrate processes.

FIG. 2A illustrates a stacked body in which the first semiconductor layer 11 and the second semiconductor layer 12 are formed on a major surface of the substrate 5. FIG. 2B corresponds to the bottom view of FIG. 2A.

The first semiconductor layer 11 is formed on the major surface of the substrate 5; and the second semiconductor layer 12 including the light emitting layer 13 is formed on the first semiconductor layer 11. Crystal growth of the first semiconductor layer 11 and the second semiconductor layer 12 including gallium nitride can be performed, for example, on a sapphire substrate using metal organic chemical vapor deposition (MOCVD).

The first semiconductor layer 11 includes a foundation buffer layer and an n-type GaN layer. The second semiconductor layer 12 includes the light emitting layer (the active layer) 13 and a p-type GaN layer. The light emitting layer 13 may include a substance configured to emit blue, violet, bluish-violet, and ultraviolet light, etc.

The surface of the first semiconductor layer 11 contacting the substrate 5 is the first surface 15a of the semiconductor layer 15; and the top surface of the second semiconductor layer 12 is a second surface 15b of the semiconductor layer 15.

Then, as illustrated in FIG. 3A and FIG. 3B which is the bottom view thereof, a trench is made in dicing regions d1 and d2 to reach the substrate 5 by piercing the semiconductor layer by, for example, Reactive Ion Etching (RIE) using a not-illustrated resist. The dicing regions d1 and d2 are formed in, for example, a lattice configuration on the substrate 5 of the wafer state. The trench made in the dicing regions d1 and d2 also is made in a lattice configuration to separate the semiconductor layer 15 into multiple chips.

The process of multiply separating the semiconductor layer 15 may be performed after the selective removal of the second semiconductor layer 12 or after the formation of the electrodes described below.

Then, as illustrated in FIG. 4A and FIG. 4B which is the bottom view thereof, a portion of the first semiconductor layer 11 is exposed by removing a portion of the second semiconductor layer 12 by, for example, RIE using a not-illustrated resist. The region where the first semiconductor layer 11 is exposed does not include the light emitting layer 13.

Continuing as illustrated in FIG. 5A and FIG. 5B which is the bottom view thereof, the p-side electrode 16 and the n-side electrode 17 are formed on the second surface. The p-side electrode 16 is formed on the top surface of the second semiconductor layer 12. The n-side electrode 17 is formed on the exposed surface of the first semiconductor layer 11.

The p-side electrode 16 and the n-side electrode 17 are formed using, for example, sputtering, vapor deposition, etc. Either one of the p-side electrode 16 and the n-side electrode 17 may be formed first; and the p-side electrode 16 and the n-side electrode 17 may be formed simultaneously from the same material.

The p-side electrode 16 includes, for example, silver, silver alloy, aluminum, aluminum alloy, etc., that are reflective with respect to the light emitted from the light emitting layer 13. A configuration including a metal protective film also may be used to prevent sulfidization and oxidization of the p-side electrode 16.

For example, a silicon nitride film or a silicon oxide film may be formed as a passivation film between the p-side electrode 16 and the n-side electrode 17 and on the end surface (the side surface) of the light emitting layer 13 by using chemical vapor deposition (CVD). Activation annealing, etc., are implemented if necessary to provide ohmic contact between the electrodes and the semiconductor layer.

Figure 6A:
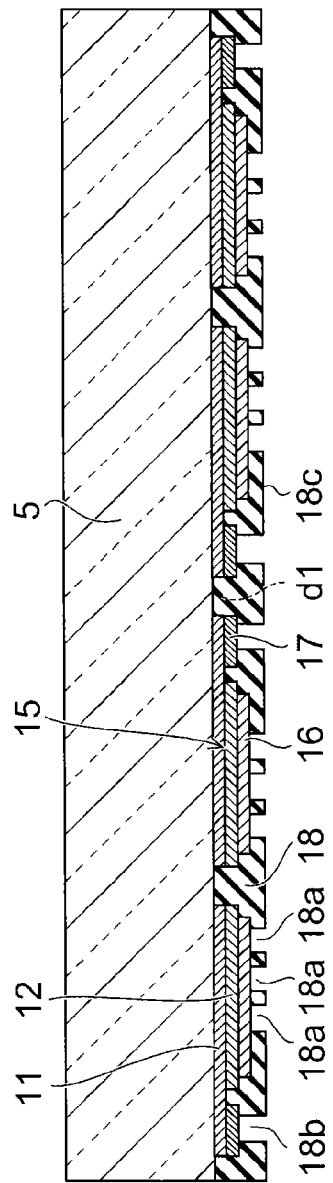

Then, as illustrated in FIG. 6A, all of the exposed portions on the major surface of the substrate 5 are covered with the insulating layer 18; and subsequently, the first via 18a and the second via 18b are made selectively in the insulating layer 18 by patterning the insulating layer 18 using, for example, wet etching. The first via 18a is multiply made. Each of the first vias 18a reaches the p-side electrode 16. The second via 18b reaches the n-side electrode 17.

An organic material such as, for example, photosensitive polyimide, benzocyclobutene, etc., can be used as the insulating layer 18. In such a case, the insulating layer 18 may be directly exposed and developed without using a resist. Alternatively, an inorganic film such as a silicon nitride film, a silicon oxide film, etc., may be used as the insulating layer 18. In the case of the inorganic film, the first via 18a and the second via 18b are made using etching after the resist is patterned.

Figure 6B:
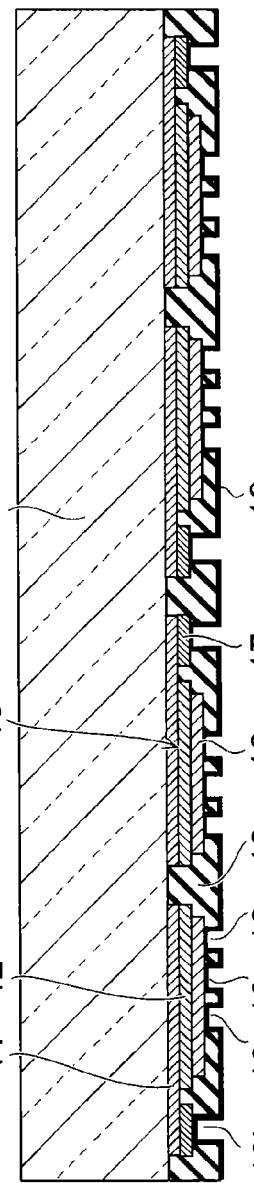

Then, as illustrated in FIG. 6B, a metal film 19 that functions as a seed metal during the plating described below is formed on the interconnect surface 18c which is the surface of the insulating layer 18 on the side opposite to the semiconductor layer 15. The metal film 19 is formed also on the inner wall and the bottom of the first via 18a and on the inner wall and the bottom of the second via 18b.

The metal film 19 is formed using, for example, sputtering. The metal film 19 includes, for example, a stacked film of titanium (Ti) and copper (Cu) stacked in order from the insulating layer 18 side.

Figure 6C:
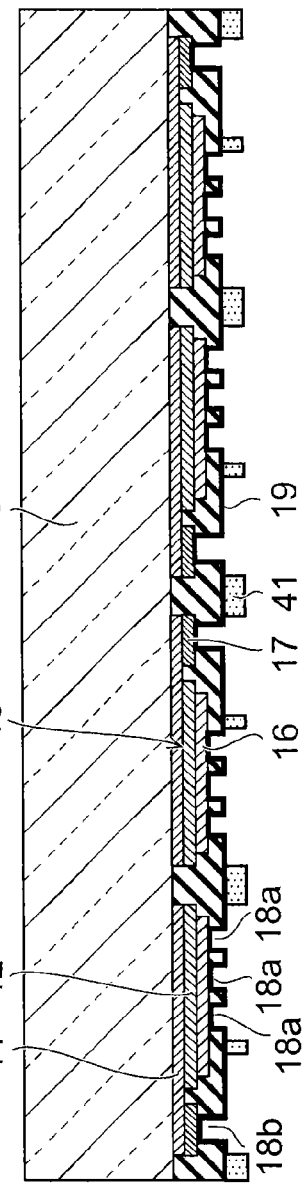

Then, as illustrated in FIG. 6C, a resist 41 is selectively formed on the metal film 19; and Cu electroplating is performed using the metal film 19 as a current path.

Thereby, as illustrated in FIG. 7A and FIG. 7B which is the bottom view thereof, the p-side interconnect layer 21 and the n-side interconnect layer 22 are formed selectively on the interconnect surface 18c of the insulating layer 18. The p-side interconnect layer 21 and the n-side interconnect layer 22 are made of, for example, a copper material formed simultaneously using plating.

The p-side interconnect layer 21 is formed also inside the first via 18a and is electrically connected to the p-side electrode 16 via the metal film 19. The n-side interconnect layer 22 is formed also inside the second via 18b and is electrically connected to the n-side electrode 17 via the metal film 19.

The p-side interconnect layer 21 can be proximal to the n-side interconnect layer 22 to the limitations of the processes; and the surface area of the p-side interconnect layer 21 can be increased. As a result, the p-side interconnect layer 21 and the p-side electrode 16 can be connected through the multiple first vias 18a; and the current distribution and the heat dissipation can be improved.

The resist 41 used in the plating of the p-side interconnect layer 21 and the n-side interconnect layer 22 is removed using a solvent or oxygen plasma.

Then, as illustrated in FIG. 8A and FIG. 8B which is the bottom view thereof, a resist 42 for forming the metal pillar is formed. The resist 42 is thicker than the resist 41 described above. The resist 41 may remain without being removed in the previous process; and the resist 42 may be formed to overlay the resist 41. A first opening 42a and a second opening 42b are made in the resist 42.

Then, Cu electroplating is performed using the metal film 19 as a current path and by using the resist 42 as a mask. Thereby, as illustrated in FIG. 9A and FIG. 9B which is the bottom view thereof, the p-side metal pillar 23 and the n-side metal pillar 24 are formed.

The p-side metal pillar 23 is formed on the surface of the p-side interconnect layer 21 inside the first opening 42a made in the resist 42. The n-side metal pillar 24 is formed on the surface of the n-side interconnect layer 22 inside the second opening 42b made in the resist 42. The p-side metal pillar 23 and the n-side metal pillar 24 are made of, for example, a copper material formed simultaneously using plating.

Figure 10A:
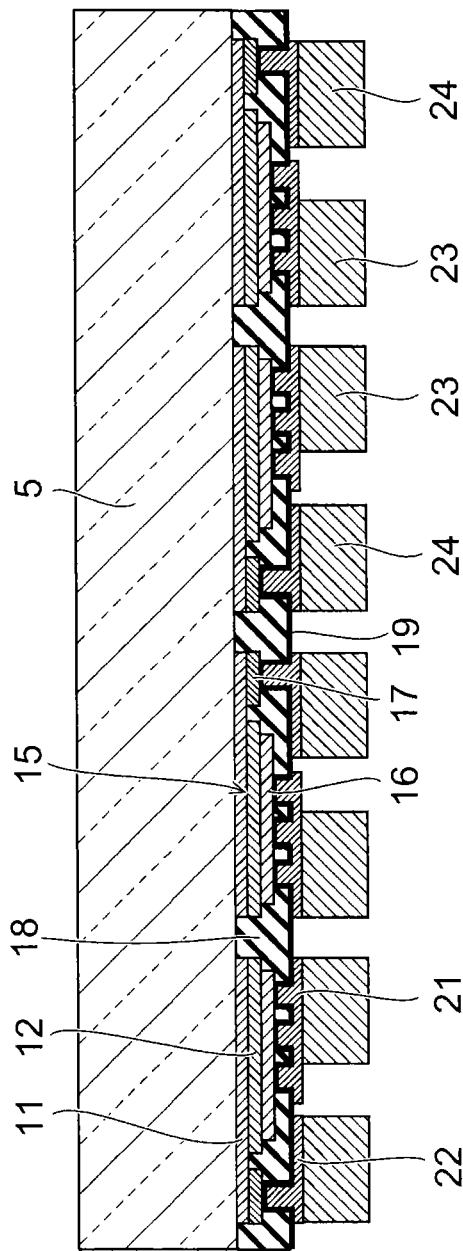
Figure 10B:
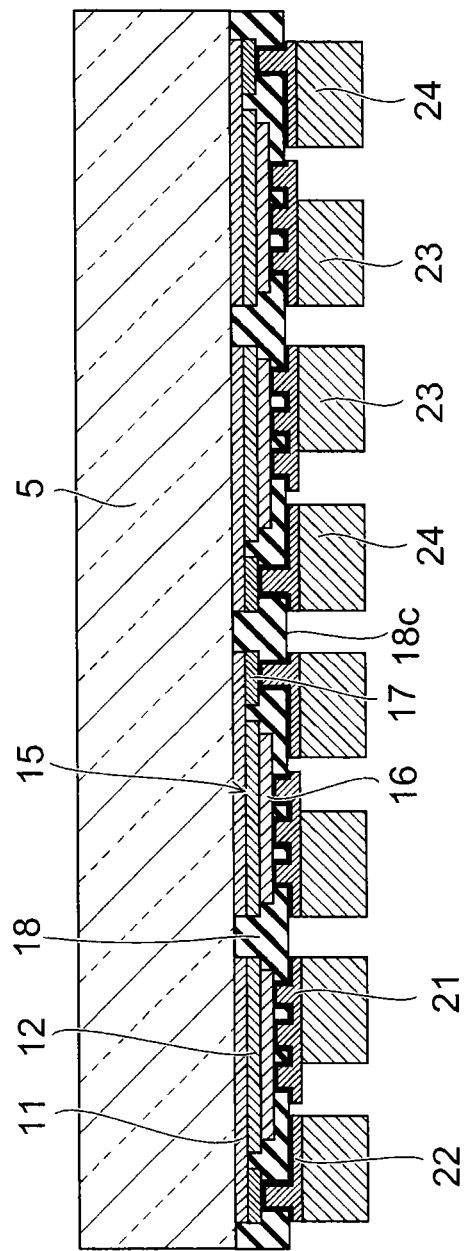

Then, the resist 42 is removed using, for example, a solvent or oxygen plasma (FIG. 10A). Subsequently, the exposed portions of the metal film 19 are removed by wet etching using the p-side metal pillar 23, the n-side metal pillar 24, and a portion of the p-side interconnect layer 21 jutting from the p-side metal pillar 23 as a mask. Thereby, as illustrated in FIG. 10B, the electrical connection between the p-side interconnect layer 21 and the n-side interconnect layer 22 via the metal film 19 is broken.

Then, as illustrated in FIG. 11A, the resin layer 25 is stacked on the insulating layer 18. The resin layer 25 covers the p-side interconnect layer 21, the n-side interconnect layer 22, the p-side metal pillar 23, and the n-side metal pillar 24.

The resin layer 25 is insulative. The resin layer 25 may be provided with a light-shielding property with respect to the light emitted from the light emitting layer by containing, for example, carbon black. The resin layer 25 may contain a powder that is reflective with respect to the light emitted from the light emitting layer.

Then, as illustrated in FIG. 11B, the substrate 5 is removed. The substrate 5 is removed by, for example, laser lift-off. Specifically, laser light is irradiated from the back surface side of the substrate 5 toward the first semiconductor layer 11. The laser light is transmissive with respect to the substrate 5 and has a wavelength in the absorption region of the first semiconductor layer 11.

When the laser light reaches the interface between the substrate 5 and the first semiconductor layer 11, the first semiconductor layer 11 proximal to the interface decomposes by absorbing the energy of the laser light. The first semiconductor layer 11 decomposes into gallium (Ga) and nitrogen gas. A micro gap is made between the substrate 5 and the first semiconductor layer 11 by the decomposition reaction; and the substrate 5 and the first semiconductor layer 11 separate.

The irradiation of the laser light is performed over the entire wafer by performing multiply for every set region; and the substrate 5 is removed.

Because the stacked body described above formed on the major surface of the substrate 5 is reinforced by the thick resin layer 25, it is possible to maintain the wafer state even in the case where there is no substrate 5. The resin layer 25 and the metals included in the interconnect layers and the metal pillars are materials more flexible than the semiconductor layer 15. Therefore, destruction of the device can be avoided even in the case where the large internal stress generated in the epitaxial process that forms the semiconductor layer 15 on the substrate 5 is relieved all at once when peeling the substrate 5.

The first surface 15a of the semiconductor layer 15, from which the substrate 5 is removed, is cleaned. For example, the gallium (Ga) adhered to the first surface 15a is removed using dilute hydrofluoric acid, etc.

Subsequently, wet etching is performed on the first surface 15a using, for example, a KOH (potassium hydroxide) aqueous solution, TMAH (tetramethylammonium hydroxide), etc. Thereby, an unevenness is formed in the first surface 15a due to the difference of the etching rates that depend on the crystal plane orientation (FIG. 12A).

Alternatively, the unevenness may be formed in the first surface 15a by performing etching after the patterning using the resist. The light extraction efficiency can be increased by the unevenness being formed in the first surface 15a.

Then, as illustrated in FIG. 12B, the inorganic film 30 is formed on the first surface 15a where the unevenness is formed. The inorganic film 30 is formed also on the top surface of the insulating layer 18 exposed between the mutually-adjacent semiconductor layers 15.

The inorganic film 30 is formed to conform to the unevenness of the first surface 15a as described above and does not fill the recesses of the unevenness. Thus, for example, CVD can be used as the method for forming the inorganic film 30. It is notable for the inorganic film 30 to be formed using, for example, plasma CVD at not more than 250 degrees C. when considering the heat resistance of the resin portion.

Figure 13A:
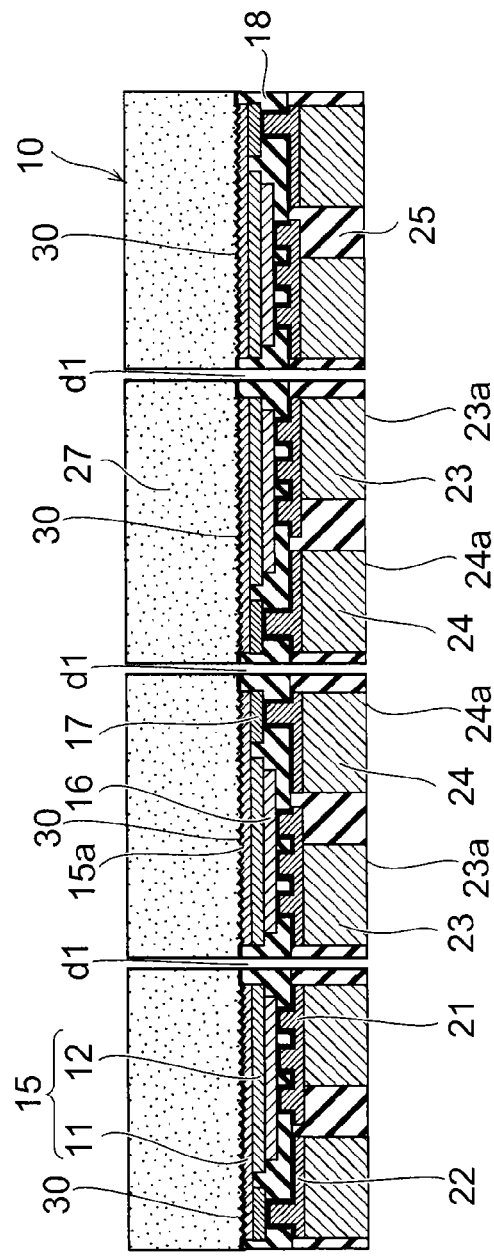

Then, as illustrated in FIG. 13A, the phosphor layer 27 is formed on the inorganic film 30 and on the insulating layer 18 exposed between the mutually-adjacent semiconductor layers 15. A lens is formed if necessary.

The phosphor layer 27 can be formed by, for example, supplying a liquid transparent resin in which phosphor particles are dispersed using a method such as printing, potting, molding, compression molding, etc., and by subsequent thermal curing. The transparent resin is transmissive with respect to the light emitted from the light emitting layer and the light emitted by the phosphor and may include a material such as, for example, a silicone resin, an acrylic resin, a phenyl resin, liquid glass, etc.

Figure 13B:
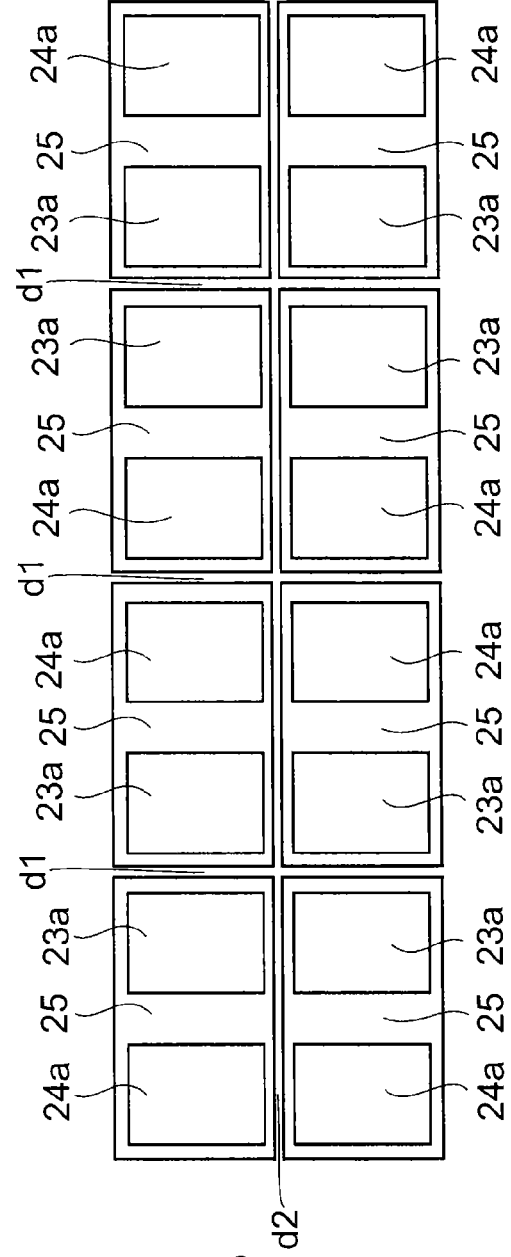

Then, the p-side external terminal 23a and the n-side external terminal 24a are exposed as illustrated in FIG. 13A and FIG. 13B which is the bottom view thereof by polishing the back surface of the resin layer 25.

Subsequently, singulation into the multiple semiconductor light emitting devices 10 is performed by cutting the phosphor layer 27, the insulating layer 18, and the resin layer 25 at the positions of the dicing regions d1 and d2 formed in a lattice configuration. For example, the cutting is performed using a dicing blade. Alternatively, the cutting may be performed using laser irradiation. For example, the cutting is performed from the resin layer 25 side in the state of being adhered to a dicing tape with the phosphor layer 27 on the lower side.

The substrate 5 is already removed when dicing. Further, damage to the semiconductor layer 15 when dicing can be avoided because the semiconductor layer 15 does not exist in the dicing regions d1 and d2. After the singulation, a structure is obtained in which the end portion (the side surface) of the semiconductor layer 15 is protected by being covered with the resin.

The singulated semiconductor light emitting device 10 may have a single-chip structure including one semiconductor layer 15 and may have a multi-chip structure including multiple semiconductor layers 15.

Because each of the processes described above until the dicing can be performed collectively in the wafer state, it is unnecessary to perform the interconnects and the packaging for every singulated individual device; and it becomes possible to drastically reduce the production costs. In other words, the interconnects and the packaging are already complete in the singulated state. Therefore, the productivity can be increased; and as a result, price reductions become easy.

Figure 14:
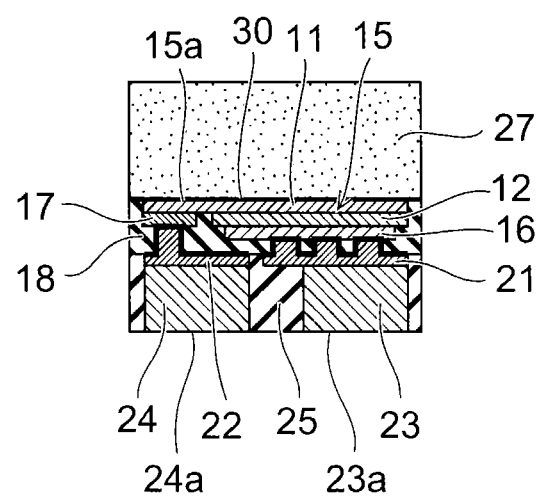
FIG. 14 is a schematic cross-sectional view of a semiconductor light emitting device of another embodiment.

As illustrated in FIG. 14, the inorganic film 30 may be formed on the first surface 15a without forming the unevenness in the first surface 15a. In such a case as well, the light extraction efficiency can be increased by preventing large changes of the refractive index of the medium in the extraction direction of the light through the first surface 15a.

The p-side interconnect layer 21 and the n-side interconnect layer 22 may be bonded to the pads of the mounting substrate without providing the p-side metal pillar 23 and the n-side metal pillar 24. Alternatively, the p-side electrode 16 and the n-side electrode 17 may be bonded to the pads of the mounting substrate without providing the p-side interconnect layer 21 and the n-side interconnect layer 22. The p-side metal pillar 23 and the n-side metal pillar 24 may be connected to the p-side electrode 16 and the n-side electrode 17 respectively without providing the p-side interconnect layer 21 and the n-side interconnect layer 22.

The red phosphor layer, the yellow phosphor layer, the green phosphor layer, and the blue phosphor layer described below can be used as the phosphor layer described above.

The red phosphor layer can contain, for example, a nitride-based phosphor of $CaAlSiN_3$:Eu or a SiAlON-based phosphor.

In the case where a SiAlON-based phosphor is used, $$(M_{1-x}R_x)_{a1}AlSi_{b1}O_{c1}N_{d1} \qquad \text{Compositional Formula (1)}$$

can be used (where M is at least one type of metal element excluding Si and Al, and it is notable for M to be at least one selected from Ca and Sr; R is a light emission center element, and it is notable for R to be Eu; and x, a1, b1, c1, and d1 satisfy the following relationships: x is larger than 0 and 1 or less, a1 is larger than 0.6 and less than 0.95, b1 is larger than 2 and less than 3.9, c1 is larger than 0.25 and less than 0.45, and d1 is larger than 4 and less than 5.7).

By using the SiAlON-based phosphor of Compositional Formula (1), the temperature characteristics of the wavelength conversion efficiency can be improved; and the efficiency in the high current density region can be increased further.

The yellow phosphor layer can contain, for example, a silicate-based phosphor of $(Sr,Ca,Ba)_2SiO_4$:Eu.

The green phosphor layer can contain, for example, a halophosphate-based phosphor of $(Ba,Ca,Mg)_{10}(PO_4)_6Cl_2$:Eu or a SiAlON-based phosphor.

In the case where a SiAlON-based phosphor is used, $$(M_{1-x},R_x)_{a2}AlSi_{b2}O_{c2}N_{d2} \qquad \text{Compositional Formula (2)}$$

can be used (where M is at least one type of metal element excluding Si and Al, and it is notable for M to be at least one selected from Ca and Sr; R is a light emission center element, and it is notable for R to be Eu; and x, a2, b2, c2, and d2 satisfy the following relationships: x is larger than 0 and 1 or less, a2 is larger than 0.93 and less than 1.3, b2 is larger than 4.0 and less than 5.8, c2 is larger than 0.6 and less than 1, and d2 is larger than 6 and less than 11).

By using the SiAlON-based phosphor of Compositional Formula (2), the temperature characteristics of the wavelength conversion efficiency can be improved; and the efficiency in the high current density region can be increased further.

The blue phosphor layer can contain, for example, an oxide-based phosphor of $BaMgAl_{10}O_{17}$:Eu.

What is claimed is:

1. A semiconductor light emitting device, comprising:
   a semiconductor layer including a first surface having an unevenness, a second surface opposite to the first surface, and a light emitting layer, the semiconductor layer including gallium nitride;
   a p-side electrode provided on the semiconductor layer;
   an n-side electrode provided on the semiconductor layer;
   an inorganic film provided to conform to the unevenness of the first surface and in contact with the first surface, the inorganic film having main components of silicon and nitrogen and a refractive index between a refractive index of the gallium nitride and a refractive index of air;
   a first insulating layer provided on the second surface, the first insulating layer including a first via communicating with the p-side electrode, a second via communicating with the n-side electrode, and an interconnect surface provided on a side opposite to the semiconductor layer;
   a p-side interconnect unit provided on the interconnect surface of the first insulating layer, the p-side interconnect unit being electrically connected to the p-side electrode through the first via;
   an n-side interconnect unit provided on the interconnect surface apart from the p-side interconnect unit, the n-side interconnect unit being electrically connected to the n-side electrode through the second via; and
   a second insulating layer provided between the p-side interconnect unit and the n-side interconnect unit,
   an unevenness being formed also in a surface of the inorganic film.

2. The device of claim 1, further comprising an insulating layer provided around the semiconductor layer, the insulating layer including a first surface facing a same direction as does the first surface of the semiconductor layer,
   the inorganic film being provided also on the first surface of the insulating layer.

3. The device of claim 1, further comprising a transparent body provided on the first surface of the semiconductor layer with the inorganic film interposed, the transparent body being transparent to an emitted light from the light emitting layer.

4. The device of claim 3, wherein the transparent body includes a transparent resin and a phosphor dispersed in the transparent resin.

5. The device of claim 4, wherein the transparent resin has a refractive index between the refractive index of the inorganic film and the refractive index of air.

6. The device of claim 1, wherein the second insulating layer is thicker than the semiconductor layer.

7. The device of claim 1, wherein the p-side interconnect unit is connected to the p-side electrode through a plurality of the first via.

8. The device of claim 1, wherein:
   the p-side interconnect unit includes
      a p-side interconnect layer provided inside the first via and on the interconnect surface, and
      a p-side metal pillar provided on the p-side interconnect layer, the p-side metal pillar being thicker than the p-side interconnect layer; and
   the n-side interconnect unit includes
      an n-side interconnect layer provided inside the second via and on the interconnect surface, and
      an n-side metal pillar provided on the n-side interconnect layer, the n-side metal pillar being thicker than the n-side interconnect layer.

9. The device of claim 8, wherein a surface area of the n-side interconnect layer is greater than a surface area of the n-side electrode.

10. The device of claim 8, wherein a planar size of the p-side interconnect layer is greater than a planar size of the p-side metal pillar.

11. The device of claim 8, wherein a thickness of the p-side metal pillar and a thickness of the n-side metal pillar are thicker than the semiconductor layer.

12. The device of claim 8, wherein
   the p-side metal pillar includes a p-side external terminal exposed from the first insulating layer and the second insulating layer, and
   the n-side metal pillar includes an n-side external terminal exposed from the first insulating layer and the second insulating layer at a same surface as the p-side external terminal.

13. The device of claim 12, wherein a distance between the exposed p-side external terminal and the exposed n-side external terminal is greater than a distance between the p-side interconnect layer and the n-side interconnect layer.

14. The device of claim 1, wherein a surface area of the p-side electrode is greater than a surface area of the n-side electrode.

15. The device of claim 1, wherein the unevenness of the inorganic film is formed so as to reflect the unevenness of the first surface of the semiconductor layer.

16. The device of claim 1, wherein the inorganic film does not fill recesses of the unevenness of the first surface of the semiconductor layer.

17. A method for manufacturing a semiconductor light emitting device, comprising:
   forming a stacked body on a substrate, the stacked body including a plurality of semiconductor layers, a p-side electrode, and an n-side electrode, the plurality of semiconductor layers being partitionally separated by a dicing region and including gallium nitride, each of the plurality of semiconductor layers including a first surface contacting the substrate, a second surface opposite to the first surface, and a light emitting layer, the p-side electrode being provided on each of the semiconductor layers, the n-side electrode being provided on each of the semiconductor layers;

forming a first insulating layer on the second surface, the first insulating layer including a first via communicating with the p-side electrode, a second via communicating with the n-side electrode, and an interconnect surface provided on a side opposite to each of the semiconductor layer;

forming a p-side interconnect unit on the interconnect surface of the first insulating layer, the p-side interconnect unit being electrically connected to the p-side electrode through the first via;

forming an n-side interconnect unit on the interconnect surface apart from the p-side interconnect unit, the n-side interconnect unit being electrically connected to the n-side electrode through the second via;

forming a second insulating layer between the p-side interconnect unit and the n-side interconnect unit;

exposing the first surface by removing the substrate;

forming an inorganic film on the exposed first surface, the inorganic film having main components of silicon and nitrogen and a refractive index between a refractive index of the gallium nitride and a refractive index of air; and cutting the stacked body in the dicing region.

18. The method of claim 17, further comprising forming an unevenness in the first surface by performing wet etching on the first surface after the removing of the substrate and prior to the forming of the inorganic film.

19. The method of claim 18, wherein the inorganic film is formed to conform to the unevenness, and an unevenness is formed also in a surface of the inorganic film.

* * * * *